United States Patent
Hwang et al.

(10) Patent No.: US 8,729,575 B2
(45) Date of Patent: May 20, 2014

(54) SEMICONDUCTOR LIGHT EMITTING DEVICE AND MANUFACTURING METHOD OF THE SAME

(75) Inventors: Jongil Hwang, Kanagawa (JP); Hung Hung, Kanagawa (JP); Yasushi Hattori, Kanagawa (JE); Rei Hashimoto, Tokyo (JP); Shinji Saito, Kanagawa (JP); Masaki Tohyama, Kanagawa (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 13/215,628

(22) Filed: Aug. 23, 2011

(65) Prior Publication Data

US 2012/0228581 A1 Sep. 13, 2012

(30) Foreign Application Priority Data

Mar. 8, 2011 (JP) ................... 2011-050011

(51) Int. Cl.
*H01L 33/00* (2010.01)
*H01L 31/072* (2012.01)

(52) U.S. Cl.
USPC ............... 257/94; 257/13; 257/79; 257/96; 257/E33.049; 257/E33.001; 257/E33.025; 257/E33.028; 257/E33.034; 438/22; 438/47

(58) Field of Classification Search
CPC ..................................... H01L 25/167
USPC ............... 257/E25.032, E33.001, E33.008, 257/E33.023, E33.025–E33.026, 257/E33.028–E33.034, E33.049, 13–14, 257/79, 86, 88–90, 94, 96–97, E25.019, 257/E25.02, E25.028; 438/34, 45–47, 22
See application file for complete search history.

(56) References Cited

U.S. PATENT DOCUMENTS

| 6,204,084 | B1 * | 3/2001 | Sugiura et al. | 438/46 |
| 6,445,127 | B1 * | 9/2002 | Oku et al. | 313/506 |
| 6,620,643 | B1 * | 9/2003 | Koike | 438/30 |
| 8,304,793 | B2 * | 11/2012 | Yoshizumi et al. | 257/95 |
| 8,399,896 | B2 * | 3/2013 | Hikosaka et al. | 257/94 |

(Continued)

FOREIGN PATENT DOCUMENTS

| JP | 11-150296 | 6/1999 |
| JP | 2003-309074 | 10/2003 |

(Continued)

OTHER PUBLICATIONS

Notification of Reason(s) for Refusal issued Mar. 19, 2013 in Japanese Patent Application No. 2011-050011 (with English translation).

*Primary Examiner* — Laura Menz
*Assistant Examiner* — Maliheh Malek
(74) *Attorney, Agent, or Firm* — Oblon, Spivak, McClelland, Maier & Neustadt, L.L.P.

(57) ABSTRACT

The semiconductor light emitting device according to an embodiment includes an N-type nitride semiconductor layer, a nitride semiconductor active layer disposed on the N-type nitride semiconductor layer, and a P-type nitride semiconductor layer disposed on the active layer. The P-type nitride semiconductor layer includes an aluminum gallium nitride layer. The indium concentration in the aluminum gallium nitride layer is between 1E18 atoms/cm$^3$ and 1E20 atoms/cm$^3$ inclusive. The carbon concentration is equal to or less than 6E17 atoms/cm$^3$. Where the magnesium concentration is denoted by X and the acceptor concentration is denoted by Y, $Y > \{(-5.35\mathrm{e}19)^2 - (X-2.70\mathrm{e}19)^2\}^{1/2} - 4.63\mathrm{e}19$ holds.

13 Claims, 4 Drawing Sheets

(56) References Cited

U.S. PATENT DOCUMENTS

| | | | |
|---|---|---|---|
| 2002/0001864 A1* | 1/2002 | Ishikawa et al. | 438/22 |
| 2003/0132440 A1* | 7/2003 | Oku et al. | 257/79 |
| 2003/0178633 A1* | 9/2003 | Flynn et al. | 257/101 |
| 2005/0121681 A1* | 6/2005 | Oku et al. | 257/97 |
| 2005/0194634 A1* | 9/2005 | Ishikawa et al. | 257/324 |
| 2005/0244997 A1* | 11/2005 | Melnik et al. | 438/46 |
| 2008/0073657 A1* | 3/2008 | Liang et al. | 257/89 |
| 2008/0151952 A1* | 6/2008 | Takatani et al. | 372/36 |
| 2008/0273562 A1* | 11/2008 | Hasegawa et al. | 372/44.01 |
| 2009/0146161 A1* | 6/2009 | Miki et al. | 257/94 |
| 2010/0032644 A1* | 2/2010 | Akita et al. | 257/13 |
| 2010/0059759 A1* | 3/2010 | Akita et al. | 257/76 |
| 2010/0244086 A1* | 9/2010 | Hanawa et al. | 257/103 |
| 2011/0037092 A1* | 2/2011 | Hori et al. | 257/98 |
| 2011/0114916 A1* | 5/2011 | Yoshizumi et al. | 257/13 |
| 2011/0138341 A1* | 6/2011 | Shatalov et al. | 716/30 |
| 2011/0147763 A1* | 6/2011 | Hanawa et al. | 257/76 |
| 2011/0223701 A1* | 9/2011 | Kyono et al. | 438/36 |
| 2012/0021549 A1* | 1/2012 | Fujikane et al. | 438/46 |
| 2012/0049328 A1* | 3/2012 | Tsuda et al. | 257/615 |
| 2012/0077298 A1* | 3/2012 | Liang et al. | 438/46 |
| 2012/0086027 A1* | 4/2012 | Yokoyama et al. | 257/94 |
| 2012/0112203 A1* | 5/2012 | Enya et al. | 257/76 |
| 2012/0132943 A1* | 5/2012 | Hikosaka et al. | 257/98 |
| 2012/0146048 A1* | 6/2012 | Kato et al. | 257/76 |
| 2012/0153258 A1* | 6/2012 | Kato et al. | 257/13 |

FOREIGN PATENT DOCUMENTS

| | | |
|---|---|---|
| JP | 2004-63537 | 2/2004 |
| JP | 2005-183964 | 7/2005 |
| JP | 2010-135848 | 6/2010 |
| JP | 4609917 | 10/2010 |

* cited by examiner

SEMICONDUCTOR LIGHT EMITTING DEVICE AND MANUFACTURING METHOD OF THE SAME

CROSS-REFERENCE TO RELATED APPLICATION

This application is based upon and claims the benefit of priority from Japanese Patent Application No. 2011-50011, filed on Mar. 8, 2011, the entire contents of which are incorporated herein by reference.

FIELD

Embodiments described herein relate generally to a semiconductor light emitting device and a method for manufacturing the same.

BACKGROUND

A group-III nitride semiconductor is used as a material of a semiconductor light emitting device such as a laser diode (LD) and a light emitting diode (LED). The group-III nitride semiconductor is represented by general formula $Al_xGa_yIn_{1-x-y}N$ (However, $0 \leq x \leq 1$, $0 \leq y \leq 1$, $0 \leq x+y \leq 1$).

In a semiconductor light emitting device using the group-III nitride semiconductor, improvement of the light emission efficiency of the device is required. Therefore, a device structure and a manufacturing method for improving the light emission efficiency have been researched.

DETAILED DESCRIPTION

Figure 1A:
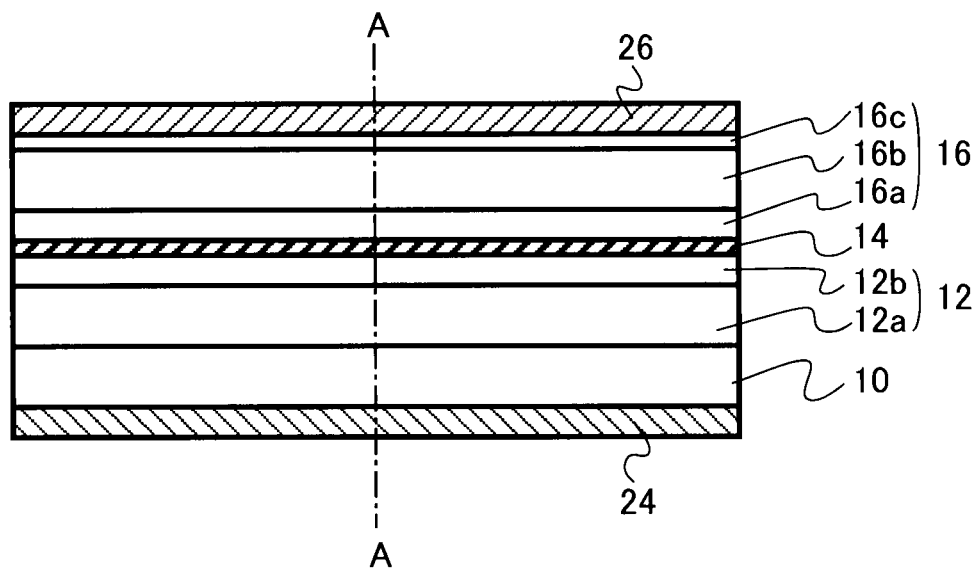
FIGS. 1A to 1B are cross sectional views illustrating a semiconductor light emitting device according to an embodiment.

The semiconductor light emitting device according to an embodiment includes an N-type nitride semiconductor layer, a nitride semiconductor active layer disposed on the N-type nitride semiconductor layer, and a P-type nitride semiconductor layer disposed on the active layer. The P-type nitride semiconductor layer includes an aluminum gallium nitride layer. The indium concentration in the aluminum gallium nitride layer is between 1E18 atoms/cm$^3$ and 1E20 atoms/cm$^3$ inclusive. The carbon concentration is equal to or less than 6E17 atoms/cm$^3$. Where the magnesium concentration in the aluminum gallium nitride layer is denoted by X and the acceptor concentration in the aluminum gallium nitride layer is denoted by Y, $Y > \{(-5.35e19)^2 - (X-2.70e19)^2\}^{1/2} - 4.63e19$ holds.

The embodiment will be hereinafter explained with reference to the drawings.

The inventors have focused on the composition of the aluminum gallium nitride ($Al_xGa_{1-x}N$ ($0<x<1$)) layer in the P-type nitride semiconductor layer in order to increase the light emission efficiency of the semiconductor light emitting device. Then, the inventors have found that the light emission efficiency of the semiconductor light emitting device can be improved by providing indium (In) in the aluminum gallium nitride ($Al_xGa_{1-x}N$ ($0<x<1$)) layer, increasing the ratio of the acceptor concentration with respect to the magnesium (Mg) concentration and reducing the carbon concentration.

Then, the inventors have found that the aluminum gallium nitride layer having the above composition can be formed by supplying indium raw material and nitrogen ($N_2$) gas as a carrier into a growth atmosphere for Metal Organic Chemical Vapor Deposition (MOCVD).

When the aluminum gallium nitride layer including magnesium as P-type impurity is formed, the inventors have first found that the acceptor concentration increases by introducing nitrogen ($N_2$) gas as carrier gas into the growth atmosphere.

However, the inventors have found that when the nitrogen gas is introduced, the carbon (C) concentration increases in the film growth at a low temperature of 1000° C. or less, in particular. Accordingly, the light emission efficiency is decreased due to deterioration of crystallinity of the aluminum gallium nitride and deterioration of hole mobility. Because the carbon concentration increases, controllability of the acceptor concentration with magnesium is decreased.

Regarding this, the inventors have found that when not only the nitrogen gas serving as the carrier gas but also the indium raw material are added into the atmosphere, the carbon concentration of the aluminum gallium nitride layer decreases, and the ratio of the acceptor concentration with respect to the magnesium concentration is further increased. As a result, the light emission efficiency is improved.

The following embodiments are based on the above findings found by the inventors.

The semiconductor light emitting device according to an embodiment includes an N-type nitride semiconductor layer, a nitride semiconductor active layer disposed on the N-type nitride semiconductor layer, and a P-type nitride semiconductor layer disposed on the active layer. The P-type nitride semiconductor layer includes an aluminum gallium nitride layer. The indium (atom) concentration in the aluminum gallium nitride layer is between 1E18 atoms/cm$^3$ and 1E20 atoms/cm$^3$ inclusive. The carbon (atom) concentration is equal to or less than 6E17 atoms/cm$^3$. Where the magnesium (atom) concentration in the aluminum gallium nitride layer is denoted by X (atoms/cm$^3$) and the acceptor concentration in the aluminum gallium nitride layer is denoted by Y (atoms/cm$^3$), $Y > \{(-5.35e19)^2 - (X-2.70e19)^2\}^{1/2} - 4.63e19$ holds.

According to the semiconductor light emitting device of the present embodiment, the ratio of the acceptor concentration with respect to the magnesium concentration serving as the P-type impurity in the aluminum gallium nitride layer is high and the carbon concentration is low. Therefore, the semiconductor light emitting device of the present embodiment achieves high light emission efficiency.

For example, a ridge stripe laser diode (LD) will be hereinafter explained as a semiconductor light emitting device.

Figure 1B:
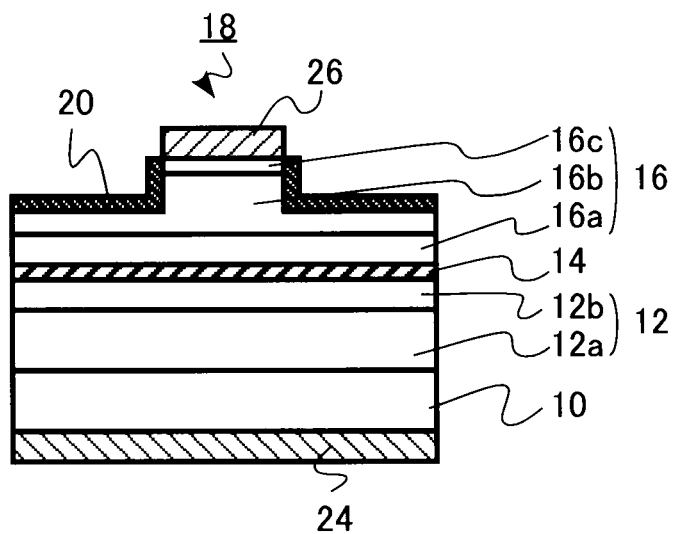

FIGS. 1A to 1B are cross sectional views illustrating the semiconductor light emitting device according to the present embodiment. FIG. 1A is a cross sectional view taken in parallel with a direction in which a ridge stripe extends. FIG. 1B is a cross sectional view taken along A-A of FIG. 1A.

A semiconductor laser diode serving as the semiconductor light emitting device according to the present embodiment is formed using a group-III nitride semiconductor. For example, an N-type cladding layer 12a of Si doped N-type $Al_{0.05}Ga_{0.95}N$ having a thickness of 1200 nm and an N-type guiding layer 12b of Si doped N-type GaN (gallium nitride)

having a thickness of 100 nm are formed, as the GaN N-type nitride semiconductor layer 12, on the N-type GaN semiconductor substrate 10.

An active layer 14 is formed on the N-type nitride semiconductor layer 12. The active layer 14 is a GaN semiconductor having multiquantum well structure (MQW), such as a multi-structure including $In_{0.12}Ga_{0.88}N$ having a thickness of 3 nm and $In_{0.03}Ga_{0.97}N$ having a thickness of 10 nm.

For example, a P-type guiding layer 16a of Mg doped P-type GaN having a thickness of 100 nm, a P-type cladding layer 16b of Mg doped P-type $Al_{0.05}Ga_{0.95}N$ having a thickness of 600 nm, and a P-type contact layer 16c of Mg doped P-type GaN having a thickness of 10 nm are formed, as the GaN P-type nitride semiconductor layer 16, on the active layer 14.

For example, an electron blocking layer of Mg doped P-type $Al_{0.2}Ga_{0.8}N$ having a thickness of 10 nm, not illustrated, may be formed between the P-type guiding layer 16a and the P-type cladding layer 16b. Alternatively, the P-type guiding layer 16a may be undoped.

A ridge stripe 18 is provided on the P-type nitride semiconductor layer 16 in order to form a waveguide region for laser light. For example, side surfaces of the ridge stripe 18 and a surface of the P-type cladding layer 16b are covered with an insulating film 20 of a silicon oxide film.

An N-side electrode 24 is provided on a lower surface of the substrate 10. A P-side electrode 26 is provided on the P-type contact layer 16c.

The P-type cladding layer 16b of Mg doped P-type $Al_{0.05}Ga_{0.95}N$ includes indium between 1E18 atoms/cm$^3$ and 1E20 atoms/cm$^3$ inclusive. As described above, since the indium is included, the indium functions as surfactant, which improves crystallinity. When the indium is less than the above range, sufficient surfactant cannot be obtained. When the indium is more than the above range, quaternary compound material is formed, and the device characteristics may be greatly changed. For the reason stated above, more preferably, the concentration of the indium is between 3E18 atoms/cm$^3$ and 3E19 atoms/cm$^3$ inclusive. Still more preferably, the concentration of the indium is between 8E18 atoms/cm$^3$ and 3E19 atoms/cm$^3$ inclusive.

In the P-type cladding layer 16b, where the magnesium (atom) concentration is denoted by X (atoms/cm$^3$) and the acceptor concentration is denoted by Y (atoms/cm$^3$), $Y > \{(-5.35e19)^2-(X-2.70e19)^2\}^{1/2}-4.63e19$ holds. The magnesium concentration is between 1E18 atoms/cm$^3$ and 1E20 atoms/cm$^3$ inclusive. More preferably, the magnesium concentration is between 5E18 atoms/cm$^3$ and 5E19 atoms/cm$^3$ inclusive. Still more preferably, the magnesium concentration is between 1E19 atoms/cm$^3$ and 3E19 atoms/cm$^3$ inclusive.

When the magnesium concentration is less than the above range, the ratio of the acceptor concentration with respect to the magnesium concentration decreases, and this may make it impossible to ensure sufficient conductivity in the P-type nitride semiconductor layer. When the magnesium concentration is more than the above range, the acceptor concentration of the magnesium decreases, and this may also make it impossible to ensure sufficient conductivity in the P-type nitride semiconductor layer.

Further, the carbon concentration of the P-type cladding layer 16b is equal to or less than 6E17 atoms/cm$^3$. As described above, the mobility of holes is improved by suppressing the carbon concentration, and the conductivity of the P-type nitride semiconductor layer improves. Therefore, improvement of the light emission efficiency can be expected. Further, when the carbon concentration is suppressed, the controllability of the acceptor concentration caused by addition of the magnesium is improved, whereby the characteristics of the semiconductor light emitting device are stabilized and the yield of production can be expected to improve. More desirably, the carbon concentration is 1E17 atoms/cm$^3$ or less. It should be noted that the concentrations of indium, magnesium, and carbon can be evaluated according to SIMS (Secondary Ion Mass Spectrometry) method. It should also be noted that the acceptor concentration can be evaluated according to ECV (Electrochemical Voltametry) method.

Subsequently, a manufacturing method of the semiconductor light emitting device according to the present embodiment will be explained with reference to FIG. 1.

The N-type cladding layer 12a of $Al_{0.05}Ga_{0.95}N$, the N-type guiding layer 12b of GaN, the active layer 14 having the multi-structure including $In_{0.12}Ga_{0.88}N/In_{0.03}Ga_{0.97}N$, the P-type guiding layer 16a of GaN, the P-type cladding layer 16b of $Al_{0.05}Ga_{0.95}N$, and the P-type contact layer 16c of GaN are successively formed on the N-type GaN substrate 10 according to Metal Organic Chemical Vapor Deposition (MOCVD).

Subsequently, an $SiO_2$ film is deposited on the upper surface of P-type contact layer 16c. A mask having a width of about 10 μm is formed, so that a ridge stripe is formed by patterning process using a resist and an etching process with ammonium fluoride. The P-type cladding layer 16b of $Al_{0.05}Ga_{0.95}N$ is etched partway using the mask by a dry etching device, whereby the ridge stripe 18 is formed.

After the mask is removed, for example, the side surfaces of the ridge stripe 18 and a surface of the P-type cladding layer 16b are covered with an insulating film 20 by deposition of the $SiO_2$ film and patterning process using the resist.

Thereafter, the P-side electrode 26 is formed by depositing and patterning an electrode metal for the P-side electrode. Further, the GaN substrate 10 on the side opposite to the ridge stripe 18 is grinded to make it into a thin film, and thereafter, an electrode metal for the N-side electrode is deposited and patterned, whereby the N-side electrode 24 is formed.

Then, a scribe line is made on the surface of the N-type GaN substrate 10 along a cleavage direction perpendicular to the ridge stripe. The N-type GaN substrate 10 is separated in a bar shape along the cleavage surface with the scribe line being a start point.

Further, the N-type GaN substrate made into the bar shape is scribed and broken in the lateral direction, whereby a piece of semiconductor light emitting device as shown in FIG. 1 is produced.

In the present embodiment, during the growth of the P-type cladding layer 16b of the aluminum gallium nitride by the MOCVD method, the magnesium raw material, the indium raw material, and the nitrogen gas serving as the carrier gas are supplied into the growth atmosphere. More specifically, while the P-type cladding layer 16b is grown, the aluminum raw material, the gallium raw material, the magnesium raw material, the indium raw material, and the nitrogen raw material are supplied into the growth atmosphere. The nitrogen gas is supplied as the carrier gas for these raw materials.

Examples of aluminum raw material include trimethyl aluminum (TMA) and triethyl aluminum (TEA). Examples of gallium raw material include trimethyl gallium (TMG) and triethyl gallium (TEG). An example of magnesium raw material is cyclopentadienyl magnesium ($Cp_2Mg$). An example of nitrogen raw material is ammonia ($NH_3$).

Examples of indium raw material include trimethyl indium (TMI) and triethyl indium (TEI). The amount of the indium raw material supplied into the growth atmosphere during the growth of the aluminum gallium nitride is desirably 50% or more with respect to a summation of the amount of supply of the aluminum raw material and the amount of supply of the gallium raw material. More desirably, it is 100% or more. It is impossible to obtain sufficient In concentration, depending on the content of the carrier gas, e.g., when the amount of supply of the indium raw material is less than the above range when, for example, the carrier gas includes hydrogen. In such case, therefore, the effect of reducing the carbon cannot be sufficiently obtained.

In this case, the amount of supply of raw material is the amount of supply of raw material represented by the number of atoms represented by the number of atoms per unit time. For example, the amount of supply of raw material is represented in mol/min.

The nitrogen gas is not always limited to 100% nitrogen. Alternatively, it may be a mixed gas of nitrogen gas and a hydrogen (H2) gas or of nitrogen gas and other gases. However, the amount of flow of nitrogen gas is preferably 10% or more with respect to the total amount of flow of the carrier gases. More preferably, it is 50% or more. Still more preferably, it is 90% or more. Still more preferably, it is 99% or more. This is because the higher the amount of flow of the nitrogen gas is, the higher the ratio of the acceptor concentration with respect to the magnesium concentration is.

The temperature at which the aluminum gallium nitride is grown is between 700 and 1100° C. inclusive. More preferably, it is between 800 and 1000° C. inclusive. When the temperature is less than the above range, crystallinity of the aluminum gallium nitride may be deteriorated. When the temperature is more than the above range, thermal stress during the growth is applied to a lower semiconductor layer such as the active layer, whereby the characteristics of the light emitting device may be deteriorated.

Figure 2:
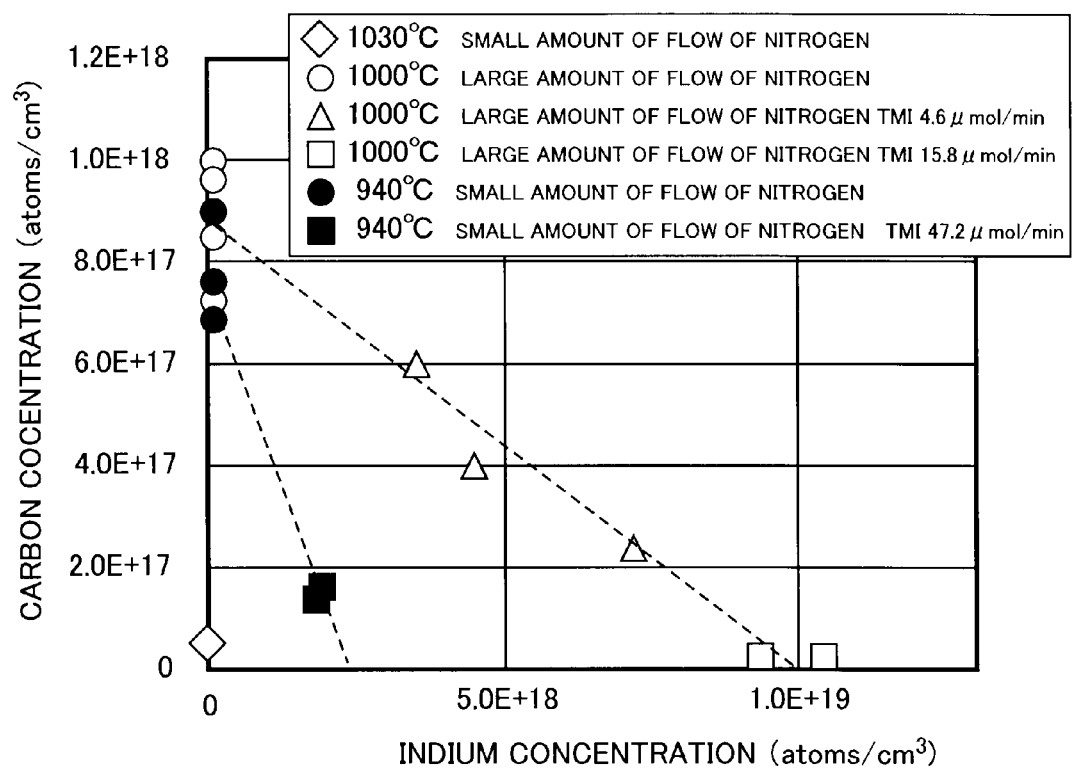
FIG. 2 is a view illustrating effects of the semiconductor light emitting device according to the present embodiment.

FIG. 2 is a view illustrating effects of the semiconductor light emitting device according to the present embodiment. Using the MOCVD method, the growth conditions when a single layer film of aluminum gallium nitride is formed are changed. Further, the relationship between the carbon concentration and the indium concentration of the formed aluminum gallium nitride is shown. Each growth condition is as follows.

(Condition 1): In FIG. 2, Rhombic Mark
  Growth temperature: 1030° C.
  Raw material: TMA, TMG, $Cp_2Mg$, $NH_3$
  Amount of TMI supply/(amount of TMA supply+amount of TMG supply)=0%
  Carrier gas: nitrogen gas, hydrogen gas
  Amount of flow of nitrogen gas/total amount of flow of carrier gas=48.8%
(Condition 2): In FIG. 2, White Circle (○) Mark
  Growth temperature: 1000° C.
  Raw material: TMA, TMG, $Cp_2Mg$, $NH_3$
  Amount of TMI supply/(amount of TMA supply+amount of TMG supply)=0%
  Carrier gas: nitrogen gas, hydrogen gas
  Amount of flow of nitrogen gas/total amount of flow of carrier gas=98.6%
(Condition 3): In FIG. 2, White Triangle (Δ) Mark
  Growth temperature: 1000° C.
  Raw material: TMA, TMG, TMI 4.6 μmol/min, $Cp_2Mg$, $NH_3$
  Amount of TMI supply/(amount of TMA supply+amount of TMG supply)=5.9%
  Carrier gas: nitrogen gas, hydrogen gas
  Amount of flow of nitrogen gas/total amount of flow of carrier gas=98.6%
(Condition 4): In FIG. 2, White Rectangle (□) Mark
  Growth temperature: 1000° C.
  Raw material: TMA, TMG, TMI 15.8 μmol/min, $Cp_2Mg$, $NH_3$
  Amount of TMI supply/(amount of TMA supply+amount of TMG supply)=19.8%
  Carrier gas: nitrogen gas, hydrogen gas
  Amount of flow of nitrogen gas/total amount of flow of carrier gas=98.6%
(Condition 5): In FIG. 2, Black Circle (●) Mark
  Growth temperature: 940° C.
  Raw material: TMA, TMG, $Cp_2Mg$, $NH_3$
  Amount of TMI supply/(amount of TMA supply+amount of TMG supply)=0%
  Carrier gas: nitrogen gas, hydrogen gas
  Amount of flow of nitrogen gas/total amount of flow of carrier gas=48.8%
(Condition 6): In FIG. 2, Black Rectangle (■) Mark
  Growth temperature: 940° C.
  Raw material: TMA, TMG, TMI 47.2 μmol/min, $Cp_2Mg$, $NH_3$
  Amount of TMI supply/(amount of TMA supply+the amount of TMG supply)=59.1%
  Carrier gas: nitrogen gas, hydrogen gas
  Amount of flow of nitrogen gas/total amount of flow of carrier gas=48.8%

As described above, when the nitrogen gas is used as the carrier gas, the acceptor concentration in the aluminum gallium nitride increases, but at the same time, carbon concentration increases. This tendency becomes more significant when the "amount of flow of nitrogen gas/total amount of flow of carrier gas" increases. The tendency also becomes more significant when the growth temperature decreases. In FIG. 2, this tendency can be seen by comparing the Condition 1 (rhombic mark), the Condition 2 (○ mark), and the Condition 5 (● mark) in which no TMI is supplied.

However, when the indium raw material is supplied as shown in FIG. 2, the carbon concentration in the aluminum gallium nitride can be reduced even when the nitrogen gas is used as the carrier gas.

Figure 3:
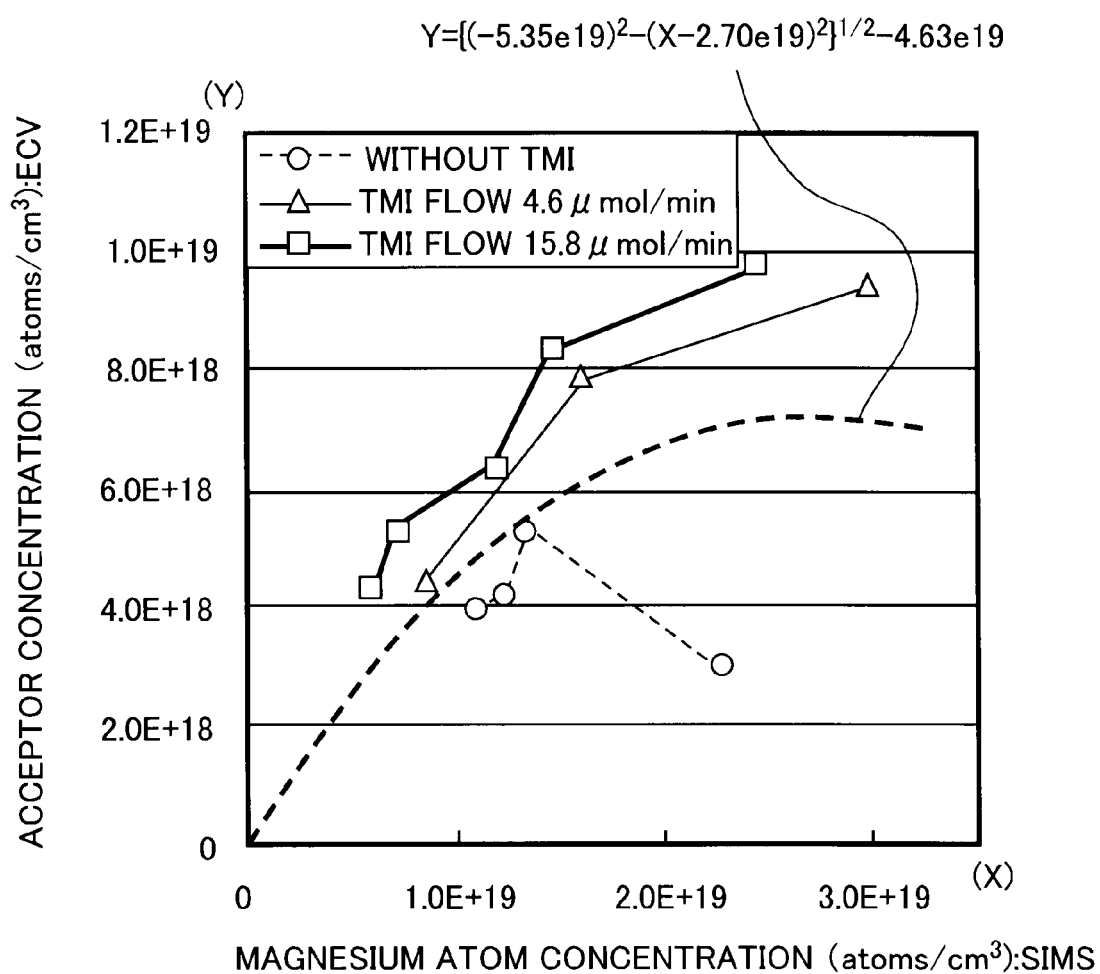
FIG. 3 is a view illustrating effects of the semiconductor light emitting device according to the present embodiment.

FIG. 3 is a view illustrating effects of the semiconductor light emitting device according to the present embodiment. FIG. 3 shows a relationship between the acceptor concentration and the atom concentration of magnesium in the aluminum gallium nitride deposited under the Condition 2 (○ mark), the Condition 3 (Δ mark), and the Condition 4 (□ mark). The concentration is measured by SIMS, and the acceptor concentration is measured by ECV. As shown in FIG. 3, when the amount of flow of TMI increases, the acceptor concentration increases even though the atom concentration of magnesium is the same. In other words, the activation rate of magnesium improves. Then, when the indium raw material is introduced, the following inequation holds, where the magnesium concentration is denoted by X and the acceptor concentration is denoted by Y:

$$Y > \{(-5.35e19)^2 - (X - 2.70e19)^2\}^{1/2} - 4.63e19$$

Figure 4:
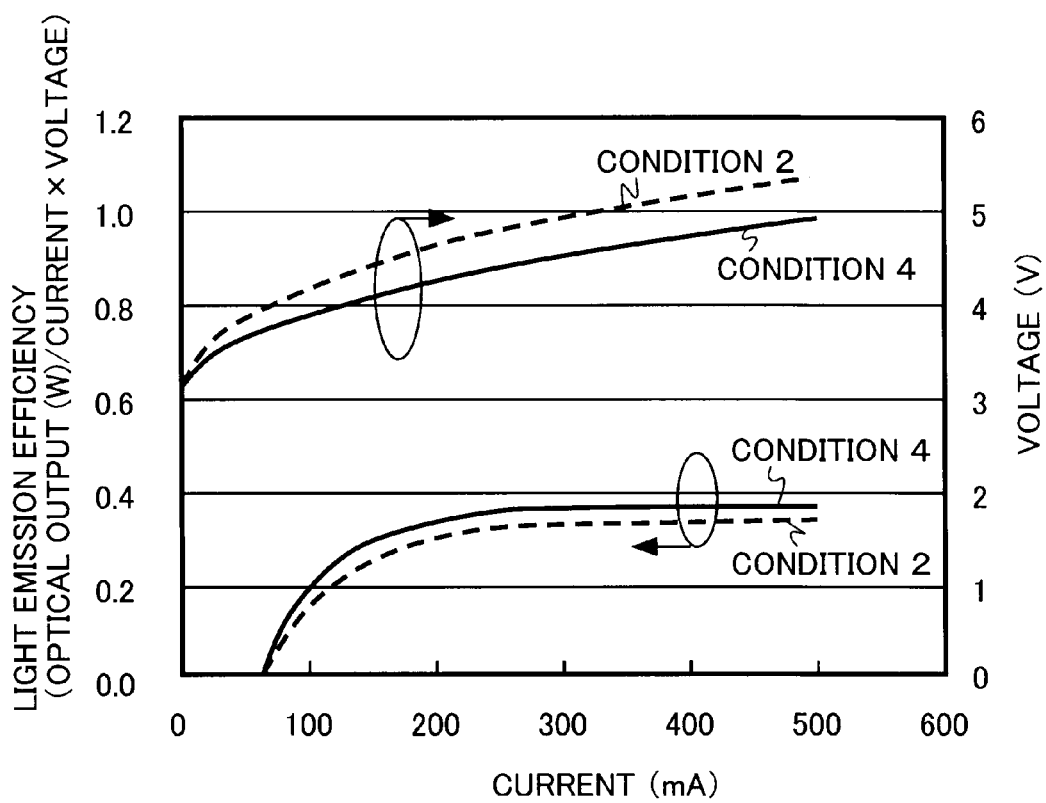
FIG. 4 is a view illustrating device characteristics of the semiconductor light emitting device according to the present embodiment.

FIG. 4 is a view illustrating device characteristics of the semiconductor light emitting device according to the present embodiment. In the laser diode having the structure shown in FIG. 1, the device characteristics have been evaluated by applying the above Condition 2 in which no TMI is supplied (○ marks in FIGS. 2 and 3 and a dotted line in FIG. 4) and the above Condition 4 in which TMI is supplied (□ marks in FIGS. 2 and 3 and a solid line in FIG. 4) to the growth condition of the P-type cladding layer 16b of the aluminum gallium nitride.

As can be seen from FIG. 4, when the indium raw material is supplied, the operating voltage is reduced, and the light emission efficiency is improved. This is considered to be because when the nitrogen gas is used as the carrier gas and the indium raw material is supplied, the activation rate of magnesium is improved, and the mobility of holes is also improved due to the decrease of the carbon concentration, whereby improving the conductivity of the P-type cladding layer 16b.

According to the manufacturing method of the embodiment, the acceptor concentration of magnesium in the P-type aluminum gallium nitride is improved, and in addition, the carbon concentration is reduced. Therefore, the conductivity of the P-type nitride semiconductor layer improves, and the semiconductor light emitting device having high light emission efficiency can be provided.

In addition, according to the manufacturing method of the embodiment, the effects can be obtained even at a low temperature of 1000° C. or less, or 950° C. or less. Therefore, thermal stress applied to a lower layer can be suppressed during the growth of the aluminum gallium nitride growth. For the reason stated above, the semiconductor light emitting device having high light emission efficiency and superior characteristics can be provided.

While certain embodiments have been described, these embodiments have been presented by way of example only, and are not intended to limit the scope of the inventions. Indeed, the semiconductor light emitting device and the manufacturing method of the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in the embodiment, the description was made using the laser diode (LD) as the semiconductor light emitting device. However, the present invention can also be applied to a light emitting diode (LED).

Further, the present invention is not limited to the application to the P-type cladding layer of the LD. The present invention can be applied to any layer as long as it is a P-type aluminum gallium nitride layer used in a semiconductor light emitting device.

What is claimed is:

1. A semiconductor light emitting device comprising:
an N-type nitride semiconductor layer;
an active layer of a nitride semiconductor disposed on the N-type nitride semiconductor layer; and
a P-type nitride semiconductor layer disposed on the active layer,
wherein the P-type nitride semiconductor layer includes a first aluminum gallium nitride layer, an indium concentration in the first aluminum gallium nitride layer is between 1E18 atoms/cm$^3$ and 1E20 atoms/cm$^3$ inclusive, a carbon concentration is equal to or less than 6E17 atoms/cm$^3$, a magnesium concentration is between 5E18 atoms/cm$^3$ and 3E19 atoms/cm$^3$ inclusive, and $Y>\{(-5.35e19)^2-(X-2.70e19)^2\}^{1/2}-4.63e19$ holds,
where X and Y denote a magnesium concentration and an acceptor concentration respectively in the aluminum gallium nitride layer.

2. The device according to claim 1, wherein the indium concentration is between 3E18 atoms/cm$^3$ and 3E19 atoms/cm$^3$ inclusive, and the carbon concentration is equal to or less than 1E17 atoms/cm$^3$.

3. The device according to claim 1, wherein the P-type nitride semiconductor layer comprises a guiding layer of P-type gallium nitride disposed on the active layer, a cladding layer disposed on the guiding layer, and a contact layer of P-type gallium nitride disposed on the cladding layer, and
the cladding layer is the aluminum gallium nitride layer.

4. The device according to claim 1, wherein the N-type nitride semiconductor layer is an N-type gallium nitride.

5. The device according to claim 1, wherein the active layer is a gallium nitride semiconductor having a multiquantum well structure.

6. The device according to claim 1, wherein a ridge stripe is provided at the P-type nitride semiconductor layer in order to form a waveguide region for laser light.

7. A method for manufacturing a semiconductor light emitting device comprising:
forming an N-type nitride semiconductor layer, an active layer of nitride semiconductor, and a P-type nitride semiconductor layer having a first aluminum gallium nitride layer including magnesium successively on a substrate by Metal Organic Chemical Vapor Deposition (MOCVD),
wherein during growth of the first aluminum gallium nitride layer, a magnesium raw material, an indium raw material, and a nitrogen gas and a hydrogen gas serving as a carrier gas are supplied into a growth atmosphere, an amount of flow of the nitrogen gas is 98.6% of total flow of the carrier gas, and a growth temperature of the first aluminum gallium nitride layer is between 800° C. and 1000° C. inclusive,
wherein the P-type nitride semiconductor layer comprises a gallium nitride layer disposed on the active layer, a P-type second aluminum gallium nitride layer disposed on the gallium nitride layer, the first aluminum gallium nitride layer disposed on the second aluminum gallium nitride layer,
a thickness of the gallium nitride layer is thicker than that of the second aluminum gallium nitride layer, a thickness of the first aluminum gallium nitride layer is thicker than that of the gallium nitride,
a band gap of the first aluminum gallium nitride layer is larger than that of the gallium nitride layer, and a band gap of the second aluminum gallium nitride layer is larger than that of the first aluminum gallium nitride layer.

8. The method according to claim 7, wherein the amount of the indium raw material supplied into the growth atmosphere during the growth of the first aluminum gallium nitride layer is 50% or more with respect to a summation of the amount of supply of the aluminum raw material and the amount of supply of the gallium raw material.

9. The method according to claim 7, wherein the P-type nitride semiconductor layer comprises a guiding layer of P-type gallium nitride disposed on the active layer, a cladding layer disposed on the guiding layer, and a contact layer of P-type gallium nitride disposed on the cladding layer, and
the cladding layer is the aluminum gallium nitride layer.

10. The method according to claim 7, wherein the N-type nitride semiconductor layer is an N-type gallium nitride.

11. The method according to claim 7, wherein the active layer is a gallium nitride semiconductor having a multiquantum well structure.

12. The method according to claim 7, wherein a ridge stripe is formed on the P-type nitride semiconductor layer.

13. The device according to claim 1, wherein the P-type nitride semiconductor layer comprises a gallium nitride layer disposed on the active layer, a P-type second aluminum gallium nitride layer disposed on the gallium nitride layer, the first aluminum gallium nitride layer disposed on the second aluminum gallium nitride layer, a thickness of the gallium nitride layer is thicker than that of the second aluminum gallium nitride layer, a thickness of the first aluminum gallium nitride layer is thicker than that of the gallium nitride layer, a band gap of the first aluminum gallium nitride layer is larger than that of the gallium nitride layer, and a band gap of the second aluminum gallium nitride layer is larger than that of the first aluminum gallium nitride layer.

\* \* \* \* \*